US007733175B2

United States Patent
Lu et al.

(10) Patent No.: US 7,733,175 B2
(45) Date of Patent: Jun. 8, 2010

(54) FEED-FORWARD AUTOMATIC-GAIN CONTROL AMPLIFIER (FFAGCA) FOR BIOMEDICAL APPLICATIONS AND AN ASSOCIATED METHOD

(75) Inventors: Shey-Shi Lu, Taipei (TW); Yu-Pin Hsu, Taipei (TW); Yu-Tso Lin, Taipei (TW); Chun-Hao Chen, Taipei (TW)

(73) Assignee: National Taiwan University, Taipei (TW)

( * ) Notice: Subject to any disclaimer, the term of this patent is extended or adjusted under 35 U.S.C. 154(b) by 21 days.

(21) Appl. No.: 12/185,380

(22) Filed: Aug. 4, 2008

(65) Prior Publication Data
US 2009/0189690 A1 Jul. 30, 2009

(30) Foreign Application Priority Data
Jan. 29, 2008 (TW) .............................. 97103258 A (51) Int. Cl.
*H03G 3/20* (2006.01)
(52) U.S. Cl. ....................................................... 330/136
(58) Field of Classification Search .................... 330/86, 330/136, 253, 255
See application file for complete search history.

(56) References Cited

U.S. PATENT DOCUMENTS

| 3,879,672 A | * | 4/1975 | Milanes ........................ 330/280 |
| 4,500,845 A | * | 2/1985 | Ehni ............................. 330/86 |
| 5,206,602 A | | 4/1993 | Baumgartner et al. |
| 6,160,449 A | * | 12/2000 | Klomsdorf et al. ........... 330/149 |

* cited by examiner

*Primary Examiner*—Robert Pascal
*Assistant Examiner*—Khiem D Nguyen
(74) *Attorney, Agent, or Firm*—Morris, Manning & Martin LLP; Tim Tingkang Xia (57) ABSTRACT

The present invention is a feed-forward automatic-gain control amplifier (FFAGCA) for biomedical applications and associated method, the FFAGCA comprises a detector, a controller, a variable gain amplifier (VGA), an input and an output. The associated method to process various kinds of biomedical signals with the FFAGCA comprises acts of adjusting gain setting with control path and simultaneously a signal amplification with signal path.

5 Claims, 11 Drawing Sheets

FEED-FORWARD AUTOMATIC-GAIN CONTROL AMPLIFIER (FFAGCA) FOR BIOMEDICAL APPLICATIONS AND AN ASSOCIATED METHOD

FIELD OF THE INVENTION

The present invention relates to an amplifier and more particularly to a feed-forward automatic-gain control amplifier (FFAGCA) for biomedical applications and associated method.

BACKGROUND OF THE INVENTION

With the dramatic development of semiconductor technology in recent years, complementary metal-oxide-semiconductor (CMOS) bio-sensors have been integrated with CMOS circuit, which make the realization of CMOS biomedical system on chip (SOC) possible, leading to miniature and low cost biomedical systems.

In general, biomedical or physiological signals have characteristics of ultra low-level signals with wide dynamic range. U.S. Pat. No. 5,206,602 published on Apr. 27, 1993, titled "Biomedical amplifier circuit" disclosed an electronic differential amplifier circuit comprising: a first stage amplifier means, a second stage amplifier means, second stage common mode feedback means, and gain feedback means is a mixed analog and digital integrated circuit (ADC) with features which are especially useful for application as a front end for physiological signal instrumentation such as electrocardiography (EGC), electroencephalography (EEG), electrogastrography (EGG), electromyography (EMG), electroneurography (ENG), electro-iconography (EOG), electroetinography (ERG).

Figure 1:
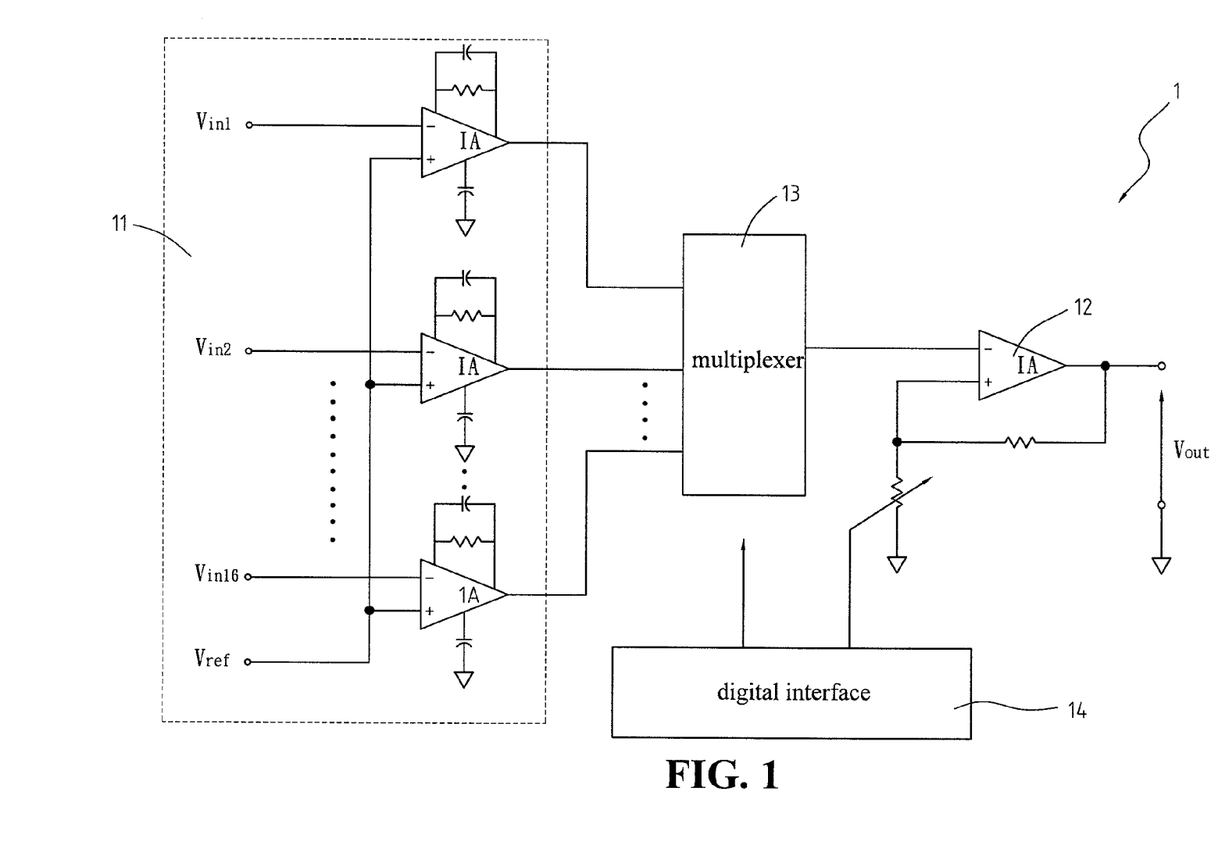
FIG. 1 is a circuit diagram of programmable amplifier of the prior arts.

Furthermore, with reference to FIG. 1, an CMOS circuit is a conventional programmable-gain amplifier (PGA) 1, and the PGA (1) comprises an instrumentation amplifier (IA) (11), an amplifier (12) coupled to the back of IA (11), a multiplexer (13) and a digital control interface (14), wherein the amplifier (12) is controlled manually through the multiplexer (13) and the digital interface (14), to amplify the biomedical signal be proceeded within a range of back end circuit. It is necessary for the PGA (1) to seize more space to encompass such as the multiplexer (13), the digital control interface (14) and etc; therefore the architecture of the PGA (1) has a defect of chip area requirement. Consequently, the PGA (1) can neither conform to the trend of miniaturization nor make realization of biomedical system on chip (SOC). Moreover, the gain of the PGA (1) is required to control by people externally.

The above-mentioned circuits are belonged to a type of feedback circuits, utilize to proceed the biomedical signal, nevertheless, generating the noise signal and caused the bigger measurement error value when the circuits output the signal, consequently, the signal is not effective to be applied in bio field, which required precise signal for user to interpret.

SUMMARY OF THE INVENTION

The primary objectives of the present invention is to amplify various kinds of biomedical signals automatically with a wide dynamic signal range, provide an appropriate gain setting and reduce noise signal to avoid error measurement.

The present invention is a feed-forward automatic-gain control amplifier (FFAGCA) for biomedical applications and an associated method, the FFAGCA comprises a detector, a controller, a variable gain amplifier (VGA), an input and an output. The associated method to process various kinds of biomedical signals with the FFAGCA comprising acts of adjusting gain setting with control path and simultaneously a signal amplification with signal path.

BRIEF DESCRIPTIONS OF THE DRAWINGS

The foregoing aspects, as well as many of the attendant advantages and features of this invention will become more apparent by reference to the following detailed description, when taken in conjunction with the accompanying drawings, wherein.

DESCRIPTION OF EMBODIMENTS

Figure 2:
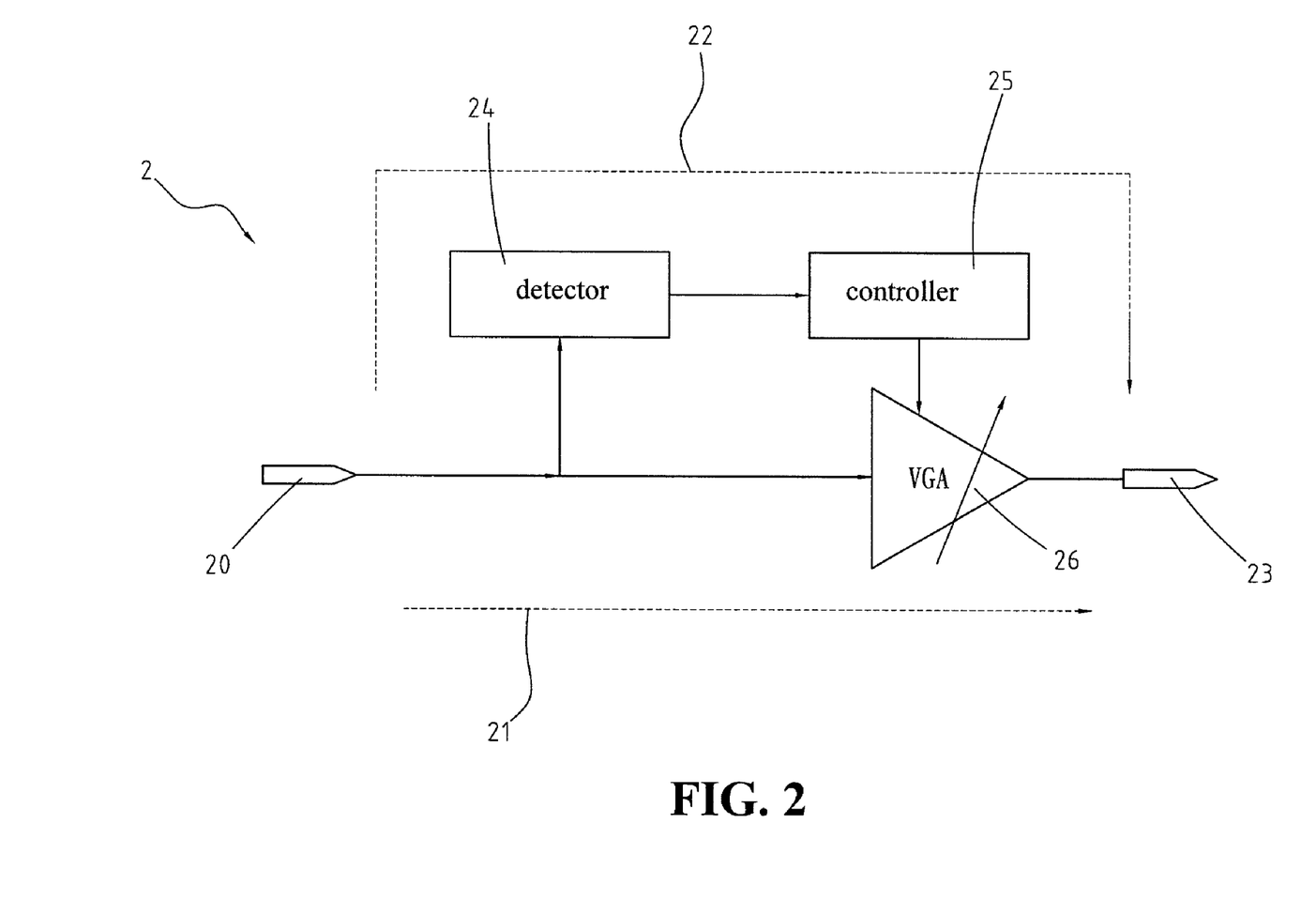
FIG. 2 is a block diagram of feed-forward automatic-gain control amplifier (FFAGCA) of the present invention.
Figure 3:
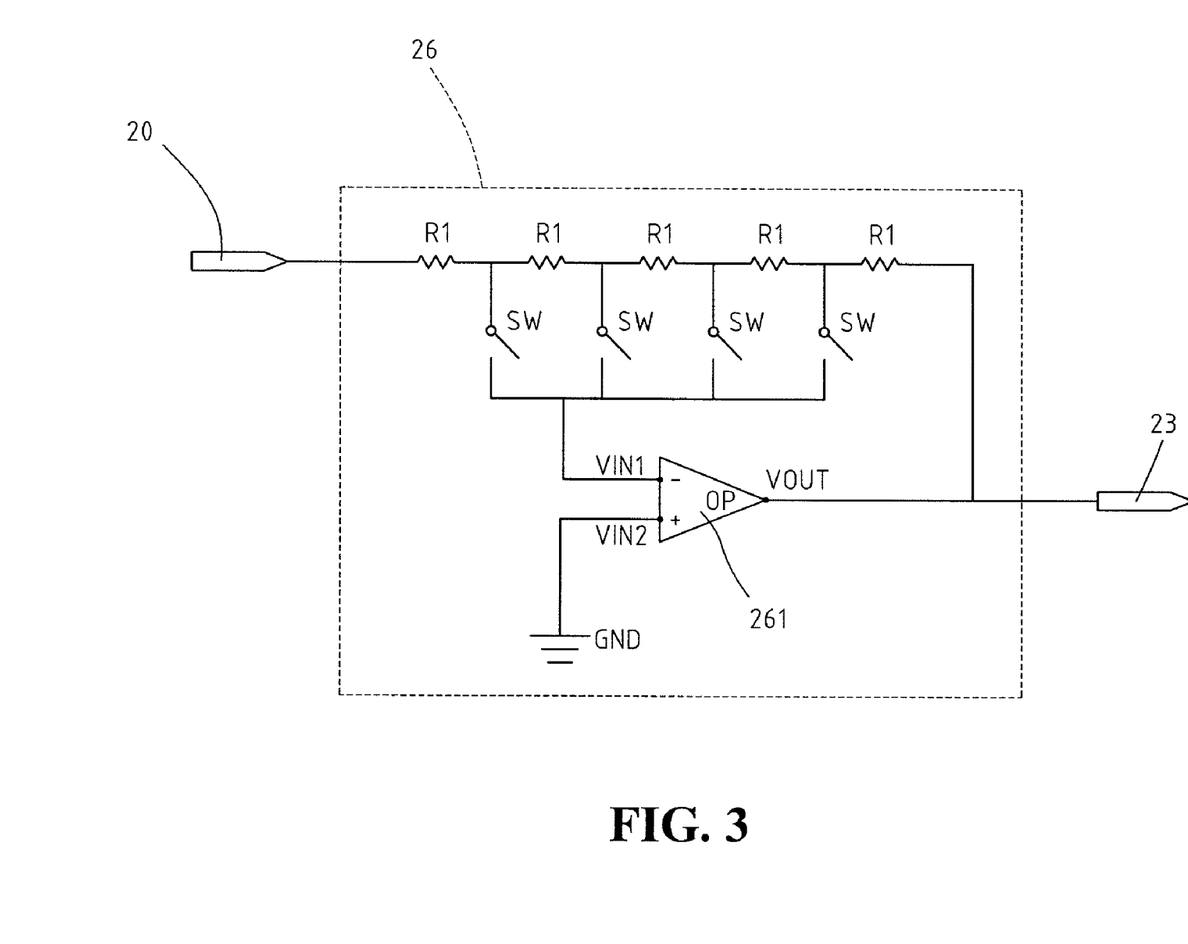
FIG. 3 is a circuit diagram of variable gain amplifier of the present invention.
Figure 4:
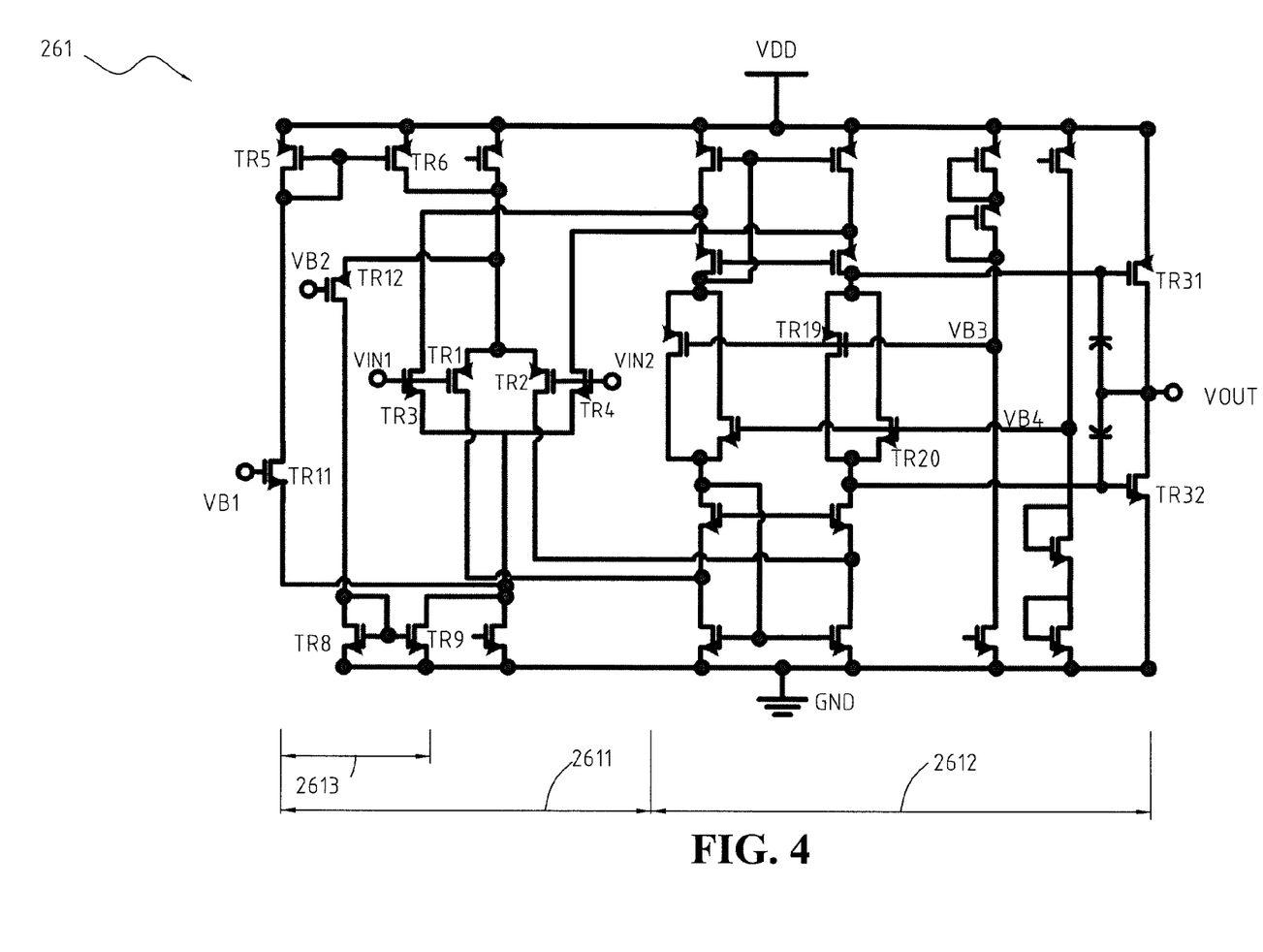
FIG. 4 is a circuit diagram of rail-to-rail operational amplifier of the present invention.

With reference to FIGS. 2, 3 and 4. A feed-forward automatic-gain control amplifier (FFAGCA) (2) for biomedical application in accordance with the present invention. The FFAGCA (2) comprises a detector (26), a controller (25), a variable gain amplifier (VGA) (26), an input (20) and an output (23).

The VGA (26) is connected to the input (20) and the output (23) and comprising five poly resistors (R1), a rail-to-rail operational amplifier (261), four switches (SW) and a ground (GND).

The poly resistors (R1) are connected in series between the input (20) and the output (23).

The rail-to-rail operational amplifier (261) is connected to the output (23) and having a negative input (VIN1), a positive input (VIN2) and an output (VOUT). The positive input (VIN2) is connected to the ground (GND), and further comprising a rail-to-rail input stage (2611) and a rail-to-rail output stage (2612).

The rail-to-rail input stage (2611) comprises two pairs of input transistors (TR1, TR2) (TR3, TR4), two operating voltage points (VB1, VB2), a voltage source (VDD), a differential input (VIN1, VIN2) and a constant-transconductance control stage (2613).

Each transistors (TR1~TR4) has a drain, a source and a gate.

The input transistors (TR1, TR2) (TR3, TR4) are connected respectively in parallel, and the gate of the input transistors (TR1, TR2) (TR3, TR4) are connected respectively to the positive input (VIN1) and the negative input (VIN2) and the drain of the input transistors (TR1, TR2) (TR3, TR4) are connected respectively connected to the rail-to-rail output stage (2612) and the source of the input transistors (TR1, TR3) are connected respectively to the source of the input transistors (TR2, TR4).

The input transistor (TR1, TR2) is an n-type metal-oxide-semiconductor field-effect transistor (MOSFET) and the input transistor (TR3, TR4) is a p-type metal-oxide-semiconductor field-effect transistor (MOSFET). Consequently the rail-to-rail input stage (2611) increases the input range from the voltage source (VDD) and the ground (GND).

The constant-transconductance control stage (2613) comprises two pairs of current mirror transistors (TR5, TR6) (TR8, TR9) and a pair of current switched transistors (TR11, TR12), and each transistors (TR5, TR6, TR8, TR9, TR11, TR12) has a drain, a source and a gate.

The gate of the current switched transistors (TR11, TR12) are connected respectively to the operating voltage points (VB1, VB2) of the rail-to-rail input stage (2611), the drain of the current switched transistors (TR11, TR12) are connected respectively to the gate of two pairs of current mirror transistors (TR5, TR6) (TR8. TR9), and the source of the current switched transistors (TR11, TR12) is respectively connected to the drain and the source of the input transistors (TR3, TR4) (TR1, TR2) of the rail-to-rail input stage (2611).

One pair of the gate of the current mirror transistors (TR5, TR6) are connected to each other and the source of the current mirror transistors (TR5, TR6) are connected to the voltage source (VDD) and the drain of the current mirror transistors (TR5, TR6) are connected respectively to the gate of the current switched transistor (TR5) and the source of the input transistors (TR1, TR2) of the rail-to-rail input stage (2611).

The other pair of the gate of the current mirror transistors (TR8, TR9) are connected to each other and the source of the current transistors (TR8, TR9) are connected to the ground (GND) and the drain of the current mirror transistors (TR8, TR9) are connected respectively to the gate of the current switched transistor (TR8) and the source of the input transistors (TR3, TR4). Since an input transconductance value is a sum of the transconductances of the input transistors (TR1, TR2) (TR3, TR4), the sum of the transconductances of the each pair of the input transistors (TR1, TR2) (TR3, TR4) would vary by a factor of two over the entire input range. However, the constant-transconductance control stage (2613) controls current flows with the current switched transistors (TR11, TR12) according to corresponding voltage that compares to operating voltage points (VB1, VB2). Consequently the transconductance is constant.

The rail-to-rail output stage (2612) comprises two pairs of transistors (TR19, TR20) (TR31, TR32) and operating voltage points (VB3, VB4).

Each transistors (TR19, TR20) (TR31, TR32) has a drain, a source and a gate.

The gate of the transistors (TR19, TR20) are connected respectively to the operating voltage points (VB3, VB4), and the source of the transistors (TR19, TR20) are connected respectively to the drain of the transistors (TR20, TR19).

The drain of the transistors (TR31, TR32) are connected to the output (VOUT), and the source of the transistors (TR31, TR32) are connected respectively to the voltage source (VDD) and the ground (GND).

Moreover, two pairs of transistors (TR9, TR20) (TR31, TR32) are connected in parallel to the source of the transistors (TR19, TR20) and the gate of the transistors (TR31, TR32).

The rail-to-rail output stage (2612) is designed to be able to drive a load. Furthermore, the transistors (TR19, TR20) (TR31, TR32) from a loop to set up a biasing circuit that fixes the voltage drop between the gates of transistors (TR31, TR32), and the operating voltage points (VB3, VB4) determine quiescent currents of transistors (TR31, TR32) that a power efficient amplifier design can be realized.

The switches (SW) are connected in parallel to the rail-to-rail operational amplifier, and each switch (SW) has two ends. One end of switch (SW) is connected to the negative input (VIN1) of the rail-to-rail operational amplifier (261), and the other end of the switches (SW) is connected between the poly resistors (R1).

As above-mentioned arrangement of the VGA (26), the VGA (26) only using five resistors (R1) compares to a conventional VGA, which effectively reduces the area of chip. Therefore, the poly resistors (R1), the switches (SW) and the rail-to-rail operational amplifier (261) within the VGA (26) is capable of various gain of 0 dB, 6 dB, 14 dB, 20 dB with 0.1 dB accuracy.

Figure 5:
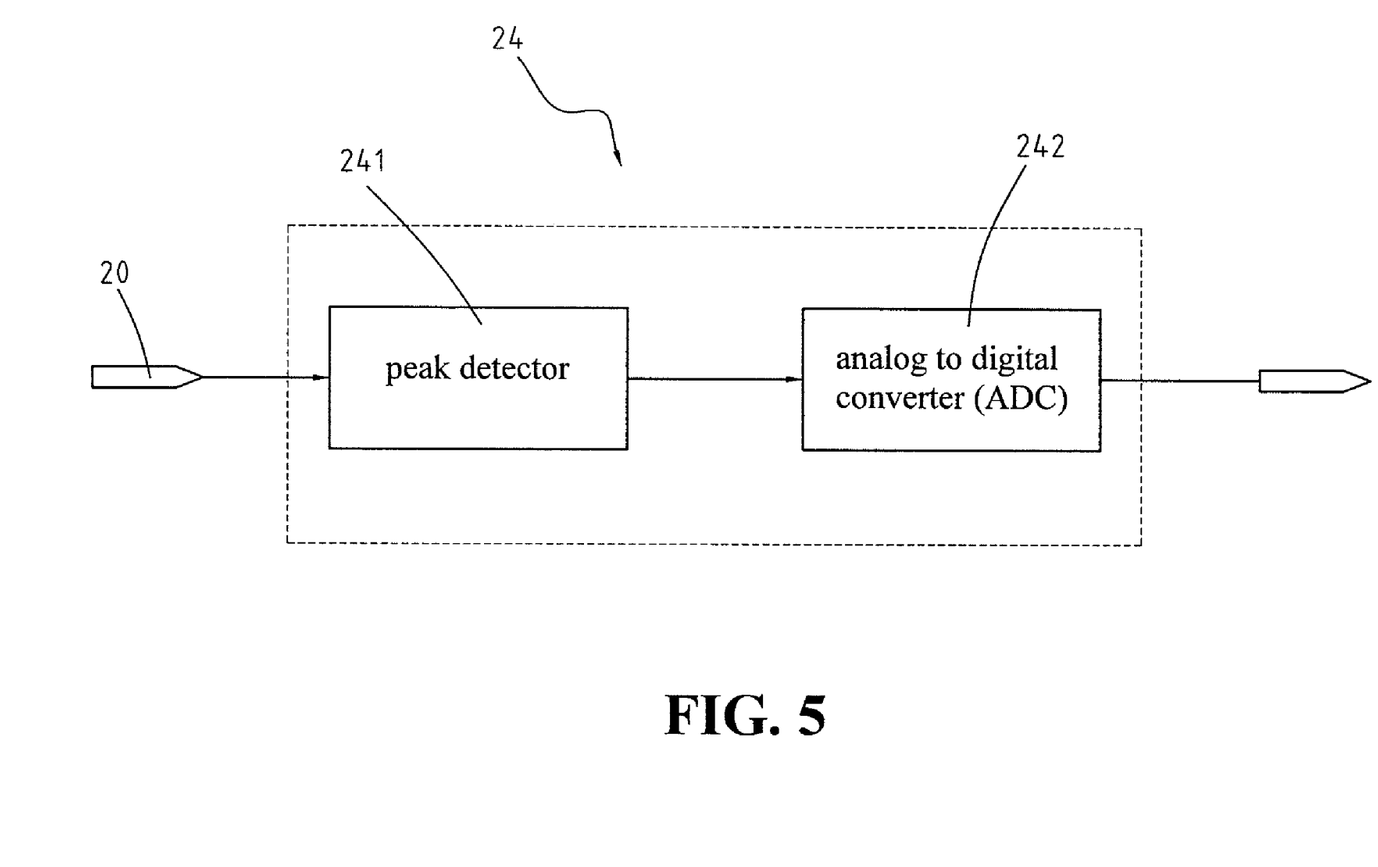
FIG. 5 is a circuit diagram of detector of the present invention.
Figure 6:
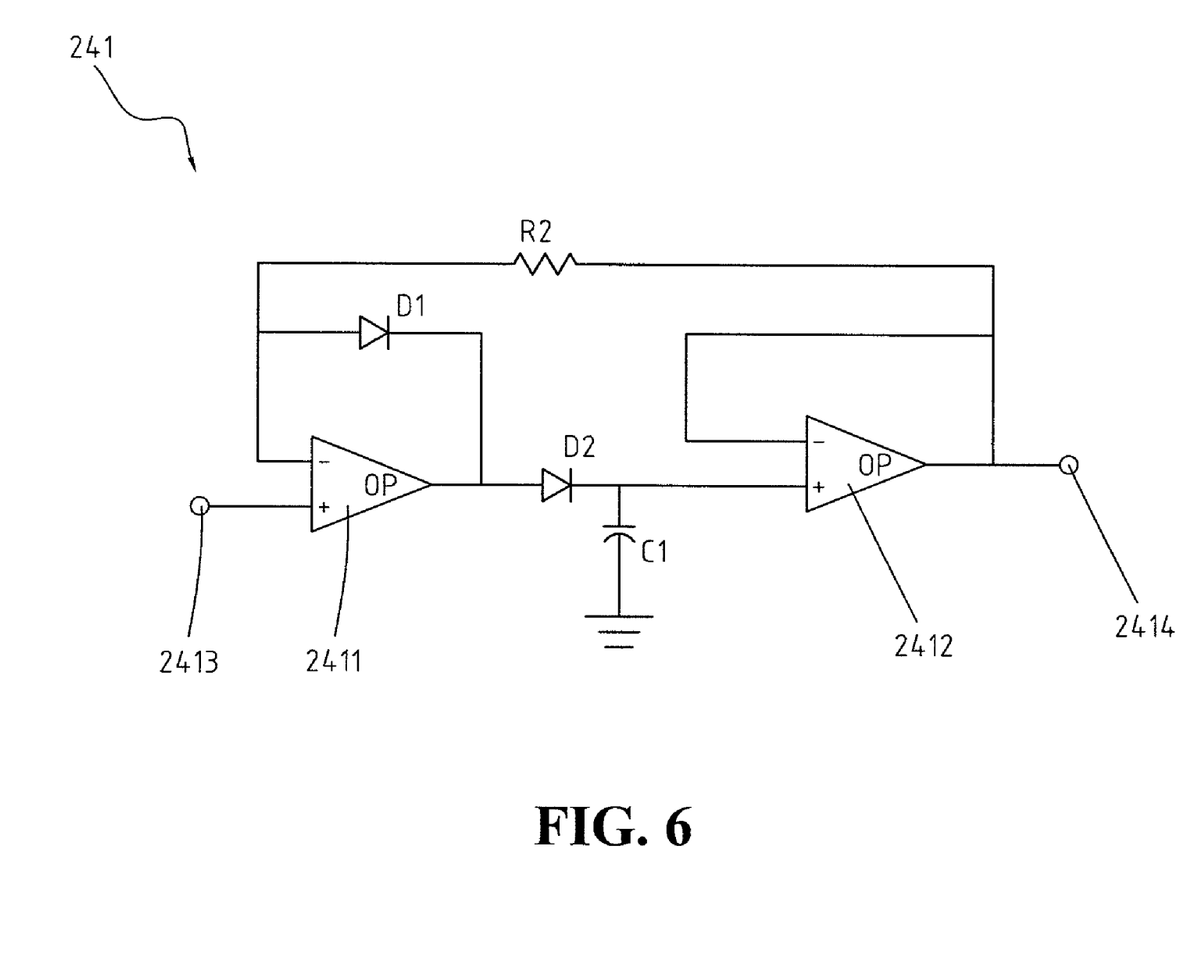
FIG. 6 is a circuit diagram of peak detector of the present invention.
Figure 7:
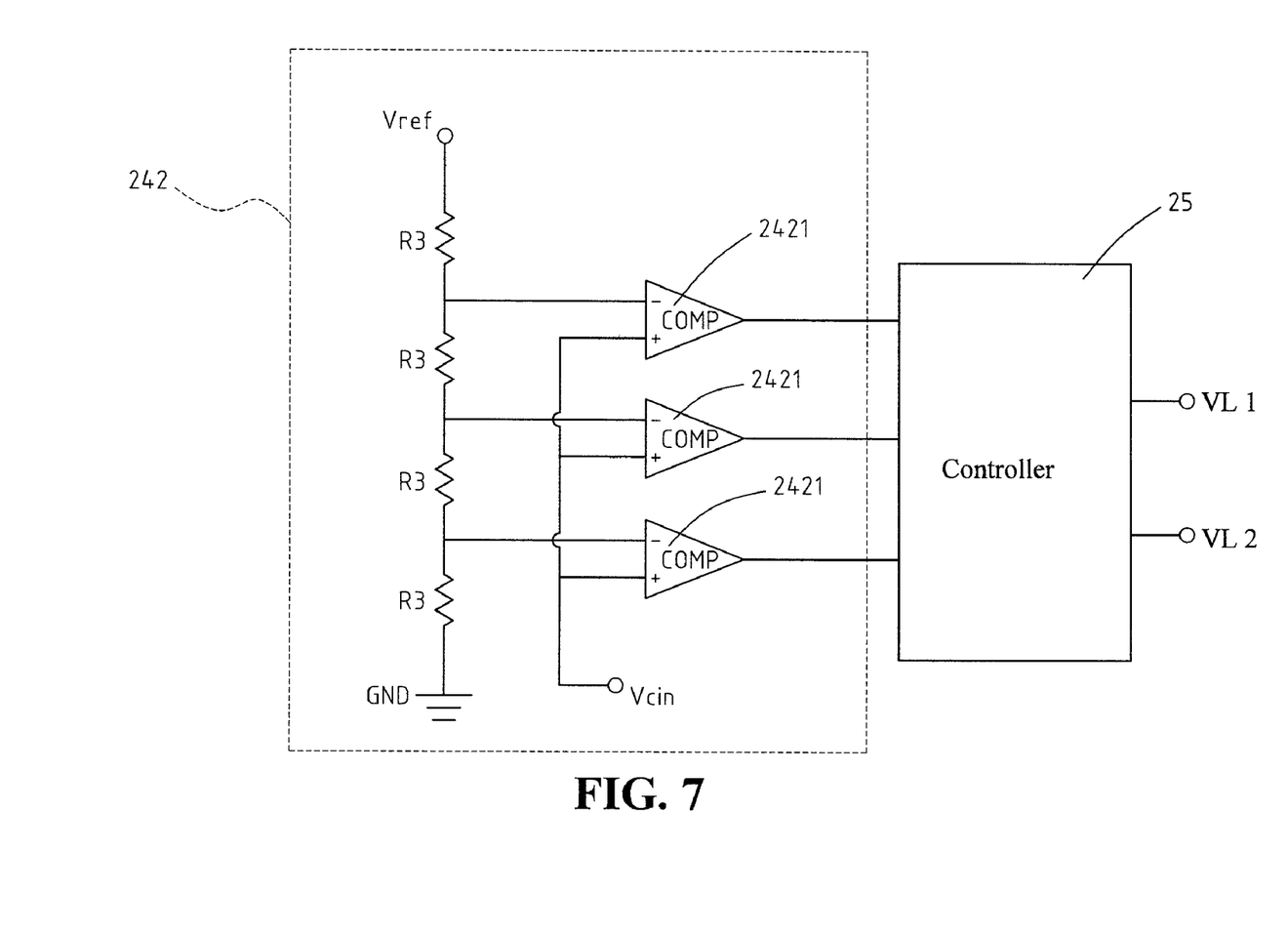
FIG. 7 is a circuit diagram of analog to digital converter of the present invention.

With reference to FIGS. 5, 6 and 7, the detector (24) is connected to the input (20) and the controller (25), wherein the detector (24) comprises a peak detector (241) and an analog to digital converter (ADC) (242).

The peak detector (241) comprises a first detected stage and a second detected stage, and the peak detector (241) is connected between the analog to digital converter (ADC) (242) and the input (20).

The first detected stage comprises a detected input (2413), a first diode (D1) in a feedback loop, a second diode (D2), a resistor (R2) and a noninverting operational amplifier (2411).

The second detected stage comprises a detected output (2414), a unit gain buffer operational amplifier (2412) and a capacitor (C1).

The noninverting operational amplifier (2411) has a negative input, a positive input and an output. The positive input is connected to the detected input (2413).

The unit gain buffer operational amplifier (2412) has a negative input, a positive input and an output. The negative input and the output both are connected to the detected output (2414).

The resistor (R2) has two ends. One end of the resistor (R2) is connected to the negative input of the noninverting operational amplifier (2411) and the other end is connected to the detected output (2414).

The capacitor (C1) has two ends. One end of the capacitor (C1) is connected to the ground (GND) and the other end is connected to the positive input of the gain buffer operational amplifier (2412).

The first diode (D1) has two ends. One end of the first diode (D1) is connected between the resistor (R2) and the negative input of the noninverting operational amplifier (2411), and the other end of the first diode (D1) is connected to the output of the noninverting operational amplifier (2411).

The second diode (D2) has two ends. One end of the second diode (D2) is connected to the output of the noninverting operational amplifier (2411) and the first diode (D1), and the other end is connected between the capacitor (C1) and the positive input of the gain buffer operational amplifier (2412).

Therefore, the detector (24) detects the amplitude of a incoming signal, the diodes (D1, D2) block a incoming signal from transferring to the second stage, which to ensure that gain of the first stage is low and the incoming signal voltage goes positive, the capacitor (C1) records a peak of the incoming signals and decreases the peak voltage and the gain buffer operational amplifier (2412) output a constant voltage of input signal.

With reference to FIG. 7, the analog to digital converter (ADC) (242) comprises three analog comparators (2421), four voltage divider resistors (R3), a converted input terminal (Vcin), a reference voltage (Vref) and a ground (GND).

The voltage divider resistors (R3) are connected in series to the reference voltage (Vref) and the ground (GND). Therefore, the voltage divider resistors (R3) adjust the reference voltage (Vref) corresponding to a quantization levels in a digital word.

The analog comparators (2421) are connected in parallel to the voltage divider resistors (R3) and the controller (25), and each analog comparator (2421) has a negative input, a positive input and a digital output. Wherein the positive inputs of the analog comparators (2421) are connected to the converted input terminal (Vcin), the negative inputs of the analog comparators (2421) are connected respectively between two voltage divider resistors (R3), therefore the analog comparators (2421) transforms an incoming signal into digital words.

The controller (25) receives signal in digital words from the analog comparators (2421) of the detector (24), and the controller (25) generates two control signals which are fed to the VGA (26) to set proper voltage gain.

Figure 8:
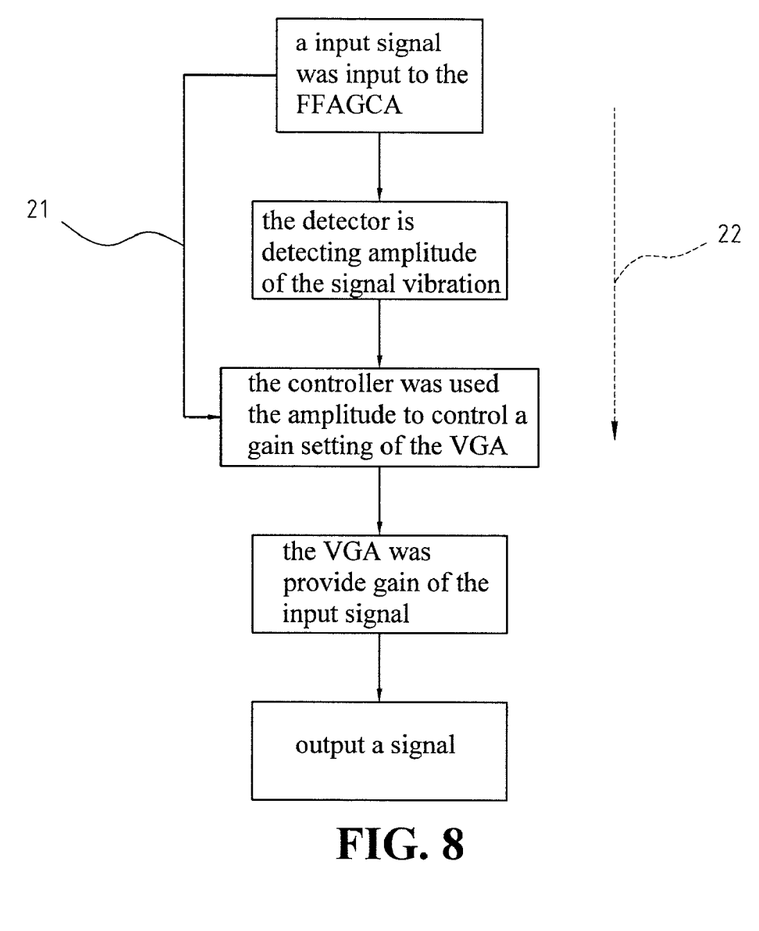
FIG. 8 is a flowchart of feed-forward automatic-gain control amplifier of the present invention.

With reference to FIGS. 2 and 8, a method to process various kinds of biomedical signals with the feed-forward automatic-gain control amplifier (FFAGCA) in accordance with the present invention comprises acts of adjusting gain setting with control path (22) and simultaneously a signal amplification with signal path (21).

The acts of an adjusting gain setting with control path (22) comprises an input signal from the detector (24), the controller (25) and a signal amplification from the VGA (26). The detector (24) detects an amplitude of the input signal and coverts the input signal into a digital signal, and the controller (25) determines the digital signal whether to adjust the gain of the input signal, and the VGA (26) amplifies the digital signal of the input signal based on the gain of the controller (25).

The acts of a signal amplification with signal path (21) comprises an input signal is fed to the VGA (26), and the VGA (26) amplify the input signal based on the gain setting. The gain setting is obtained by the poly resistors (R1) and switches (SW) with the rail-to-rail operational amplifier (261) according to the gain determination from the controller.

Figure 9:
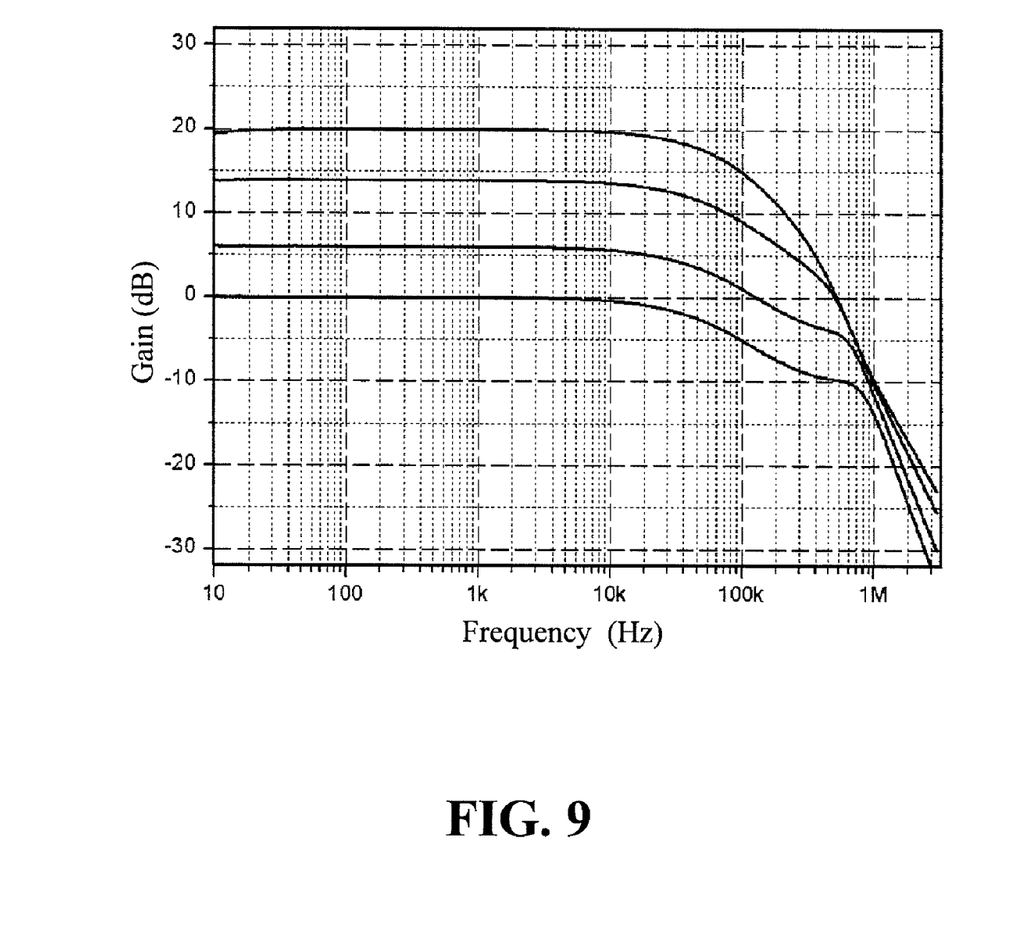
FIG. 9 is a diagram illustrating the measured transfer curve of feed-forward automatic-gain control amplifier of the present invention.

With reference to FIG. 9, showing a measured transfer curve of FFAGCA; when the frequency of the FFAGCA is between 10-10k Hz, the measurement result of the gain of the FFAGCA is 0 dB, 6 dB, 14 dB and 20 dB actuality proving that the applied range of the FFAGCA is very wide.

Figure 10:
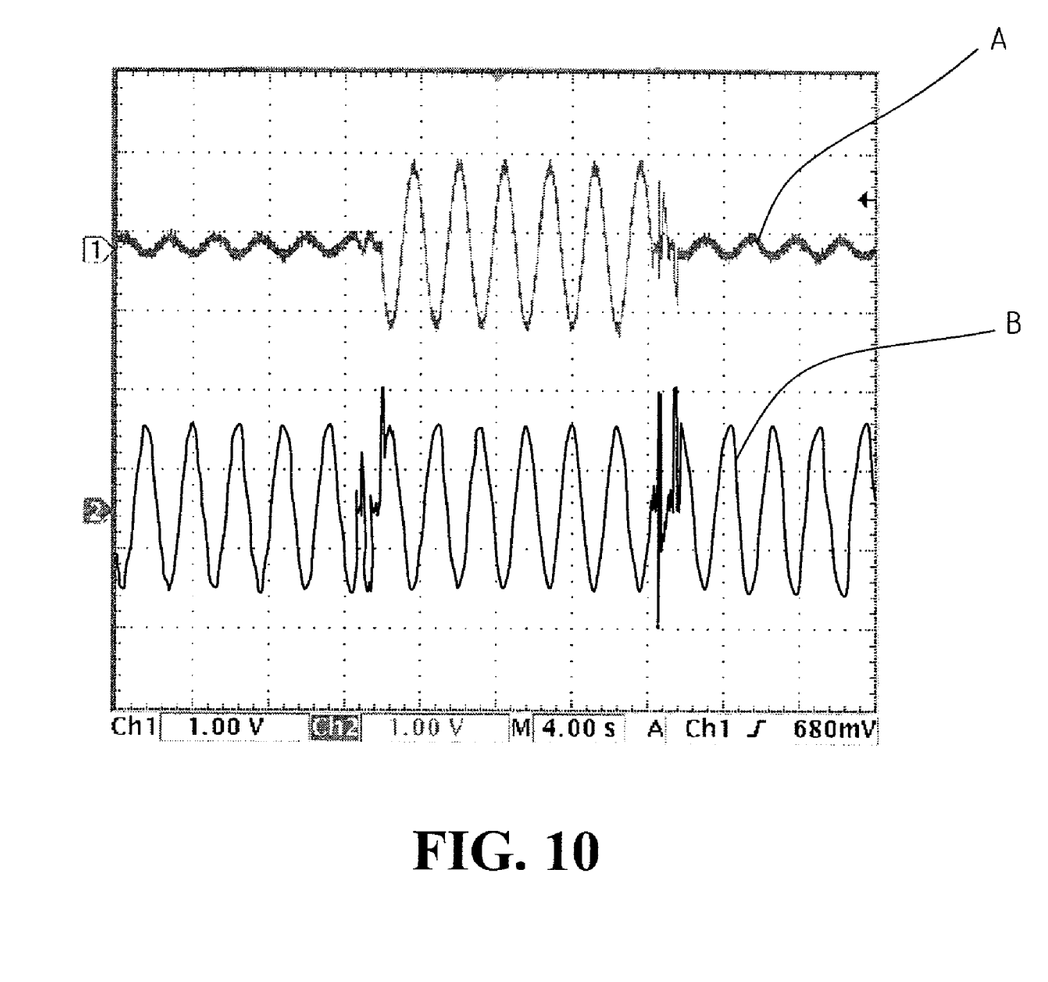
FIG. 10 is a diagram illustrating the measured waveforms of feed-forward automatic-gain control amplifier of the present invention.

Furthermore, as shown in FIG. 10, illustrating a measured waveforms of the FFAGCA, when the frequency of input signal is 1 KHz, measuring of inputted signal and output signal to get the waveform. The FFAGCA could output a stable signal B when the inputted signal A in the states of minimum and maximum, and a transient response produced at the intersection of minimum and maximum transform.

The characteristics of the FFAGCA has a automatic-gain feature implementing with the controller (25) and VGA (26), a wide range feature of input signal to the rail-to-rail operational amplifier, low noise, low power consumption and SoC, so the FFAGCA could be applied in the biomedical application well. The biomedical applications are such as, but not limited to, for example, electrocardiography (ECG), electroencephalography (EEG), electrogastrography (EGG), electromyography (EMG), electroneurography (ENG), electrooculography (EOG) or electroetinography (ERG) as shown in Table 1.

TABLE 1

| The signal of biomedical | Measurement range | Frequency Range (Hz) |
|---|---|---|
| electrocardiography (ECG) | 0.5~4 mV | 0.01~250 |
| electroencephalography (EEG) | 5~300 uV | DC~150 |
| electrogastrography (EGG) | 10~1000 uV | DC~1 |
| electromyography (EMG) | 0.1~5 mV | DC~10k |
| electroneurography (ENG) | 10 uV~3 mV | DC~10k |
| electro-iconography (EOG) | 50~3500 uV | DC~50 |
| electroetinography (ERG) | 0~900 uV | DC~50 |

Figure 11:
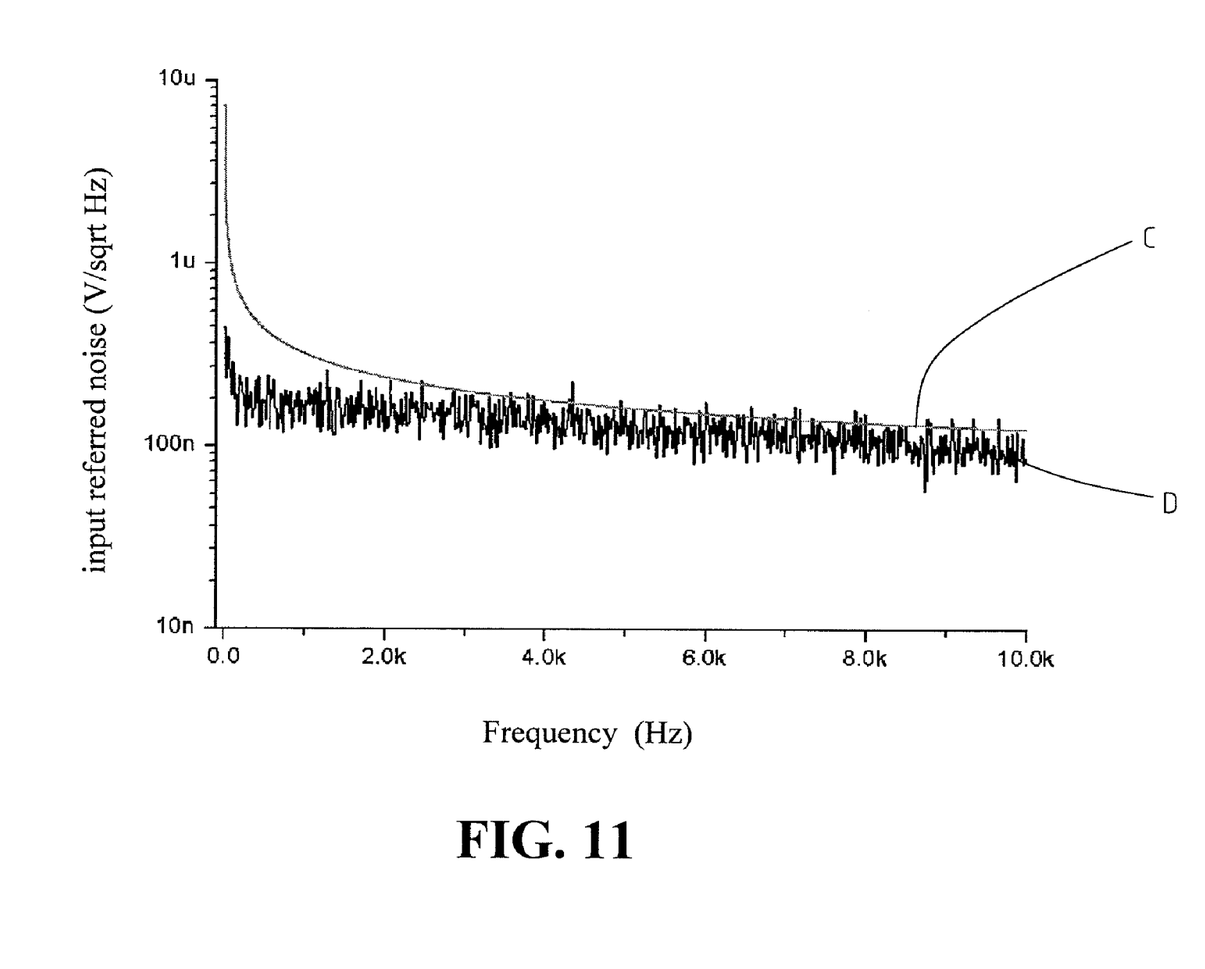
FIG. 11 is a diagram illustrating the simulated and measured input-referred noise spectrum of feed-forward automatic-gain control amplifier of the present invention.

Furthermore, FIG. 11 is a diagram illustrating the simulated and measured input-referred noise spectrum of FFAGCA of the present invention. When the FFAGCA is utilized in a detecting interface system of ECG, the measured noise graph as shown in FIG. 11. Moreover, when the frequency is less than 10 KHz, the deviation between the simulated input-referred noise C and the measured input-referred noise D are quite insignificant. Besides, when the noise is less than 200 nV/Hz, the noise for biomedical application is negligible in accordance with the present invention, the FFAGCA can be applied well in a detector system of biomedical applications.

While the invention has been particularly shown and described with reference to the preferred embodiment thereof, these are merely examples to help clarify the invention and are not intended to limit the invention. It will be understood by those skilled in the art that various changes, modifications, and alterations in form and details may be made therein without departing from the spirit and scope of the invention, as set forth in the following claims.

What is claimed is:

1. A feed-forward automatic-gain control amplifier (FFAGCA) for biomedical applications comprising:
    an input;
    an output;
    a controller;
    a detector being connected to the input and the controller; and
    a variable gain amplifier (VGA) being connected to the input, the controller and the output, further comprising:
    a peak detector; and
    an analog to digital converter (ADC) being connected to the peak detector, and wherein the peak detector comprising:
    a detector input;
    a detector output;
    a first detector stage being connected to the detector input, and;
    a second detector stage, the second detector stage being connected to the detector output, and wherein the first detector stage comprising:
    a detected input;
    a resistor, the resistor having two ends, one end of the resistor being connected to the negative input of a non-inverting operational amplifier and the other end being connected to the detector output;
    the noninverting operational amplifier having a negative input, a positive input and an output, wherein positive input being connected to the detector input;
    a first diode in a feedback loop, the first diode having two ends, one end of the first diode being connected between the resistor and the negative input of the noninverting operational amplifier, and the other end of the first diode being connected to the output of the noninverting operational amplifier; and a second diode, the second diode having two ends, one end of the second diode being connected to the output of the noninverting operational amplifier and the first diode in series, and the other end being connected between a capacitor and the positive input of the gain buffer operational amplifier.

2. The feed-forward automatic-gain control amplifier for biomedical application as claimed in claim 1, wherein the second detector stage comprising:

a detector output;

a unit gain buffer, the unit gain buffer operational amplifier having a negative input, a positive input and an output; the negative input and the output both connect to the detector output, and;

the capacitor, the capacitor having two ends, one end of the capacitor being connected to the ground and the other end being connected to the positive input of the gain buffer operational amplifier.

3. The feed-forward automatic-gain control amplifier for biomedical application as claimed in claim 1, wherein the analog to digital converter comprising:

a converted input terminal;

a reference voltage, and;

a ground;

four voltage divider resistors being connected in series to the reference voltage and the ground;

three analog comparators being connected in parallel to the voltage divider resistors and the controller, and each analog comparator having a negative input, a positive input and a digital output, wherein the positive inputs of the analog comparators being connected to the converted input terminal, the negative inputs of the analog comparators being connected respectively between two voltage divider resistors.

4. A feed-forward automatic-gain control amplifier (FF-AGCA) for biomedical applications comprising:

an input;

an output;

a controller;

a detector being connected to the input and the controller; and a variable gain amplifier (VGA) being connected to the input, the controller and the output, wherein the variable gain amplifier (VGA) comprising:

a ground;

a rail-to-rail operational amplifier, the rail-to-rail operational amplifier being connected to the output of the feed-forward automatic-gain control amplifier having:

a positive input being connected to the ground and the;

a negative input, and;

an output being connected to the feed-forward automatic-gain control amplifier;

at least two poly resistors being connected in series between the input and the output of the feed-forward automatic-gain control amplifier, and;

at least two switches, and each switch having two ends, one end of switch being connected in parallel to the negative input of the rail-to-rail operational amplifier, and the other end of the switches being connected between the poly resistors, wherein the rail-to-rail operational amplifier further comprising:

a rail-to-rail input stage, and;

a rail-to-rail output stage being connected to the rail-to-rail input stage, and wherein the rail-to-rail input stage comprising:

two pairs of input transistors, and each transistor having:

a drain;

a source, and;

a gate;

the input transistors being connected respectively in parallel, and the gate of the input transistors being connected respectively to the positive input and the negative input and the drain of the input transistors being connected respectively connected to the rail-to-rail output stage, and the source of the input transistors being connected respectively to the other;

two operating voltage points;

a voltage source;

a differential input, and;

a constant-transconductance control stage, and the constant-transconductance control stage comprising:

two pairs of current mirror transistors;

a pair of current switched transistors, and each of transistor having:

a drain;

a source, and; a gate;

wherein, the gate of the current switched transistors being connected respectively to the operating voltage points of the rail-to-rail input stage, the drain of the current switched transistors being connected respectively to the gate of two pairs of current mirror transistors, and the source of the current switched transistors being respectively connected to the drain and the source of the input transistors of the rail-to-rail input stage;

one pair of the gate of the current mirror transistors being connected to each other and the source of the current mirror transistors being connected to the voltage source and the drain of the current mirror transistors being connected respectively to the gate of the current switched transistor and the source of the input transistors of the rail-to-rail input stage;

the other pair of the gate of the current mirror transistors being connected to each other and the source of the current transistors being connected to the ground and the drain of the current mirror transistors being connected respectively to the gate of the current switched transistor and the source of the input transistors.

5. The feed-forward automatic-gain control amplifier for biomedical application as claimed in claim 4, wherein the rail-to-rail output stage comprising:

two pairs of transistors, each transistors having: a drain;

a source, and;

a gate;

operating voltage points;

wherein two pairs of transistors being connected in parallel to the source of the transistors and the gate of the transistors, and the gate of the transistors being connected respectively to the operating voltage points, and the source of the transistors being connected respectively to the drain of the transistors, and;

the drain of the transistors being connected to each other and the output, and the source of the transistors being connected respectively to the voltage source and the ground.

* * * * *